(12) United States Patent
Lee et al.

(10) Patent No.: US 10,942,446 B2
(45) Date of Patent: Mar. 9, 2021

(54) MASK CLEANING APPARATUS AND METHOD FOR CLEANING MASK

(71) Applicant: SEMES CO., LTD., Chungcheongnam-do (KR)

(72) Inventors: Seong Soo Lee, Gyeonggi-do (KR); Jeong Yeong Park, Chungcheongnam-do (KR); Sung Bum Park, Chungcheongnam-do (KR); Byung Chul Kang, Chungcheongnam-do (KR)

(73) Assignee: SEMES CO. LTD., Chungcheongnam-do (KR)

(*) Notice: Subject to any disclaimer, the term of this patent is extended or adjusted under 35 U.S.C. 154(b) by 0 days.

(21) Appl. No.: 16/158,698

(22) Filed: Oct. 12, 2018

(65) Prior Publication Data
US 2019/0113839 A1    Apr. 18, 2019

(30) Foreign Application Priority Data
Oct. 16, 2017    (KR) .................. 10-2017-0133812

(51) Int. Cl.
| | |
|---|---|
| *G03F 1/82* | (2012.01) |
| *G03F 7/20* | (2006.01) |
| *H01L 21/02* | (2006.01) |
| *H01L 21/311* | (2006.01) |
| *H01L 21/67* | (2006.01) |

(52) U.S. Cl.
CPC .............. *G03F 1/82* (2013.01); *G03F 7/70908* (2013.01); *G03F 7/70925* (2013.01); *H01L 21/02052* (2013.01); *H01L 21/02057* (2013.01); *H01L 21/31133* (2013.01); *H01L 21/67051* (2013.01)

(58) Field of Classification Search
CPC combination set(s) only.
See application file for complete search history.

(56) References Cited

U.S. PATENT DOCUMENTS

| | | | |
|---|---|---|---|
| 2004/0087158 A1* | 5/2004 | Izumi | B08B 3/02 438/689 |
| 2006/0257751 A1* | 11/2006 | Eggers | B82Y 30/00 430/5 |
| 2013/0084709 A1* | 4/2013 | Miyagi | H01L 21/67028 438/745 |

(Continued)

FOREIGN PATENT DOCUMENTS

| | | |
|---|---|---|
| CN | 103077907 A | 5/2013 |
| CN | 103551503 A | 1/2014 |
| CN | 104952699 A | 9/2015 |

(Continued)

OTHER PUBLICATIONS

Translation of JPH 10260522.*

(Continued)

*Primary Examiner* — Jiong-Ping Lu
(74) *Attorney, Agent, or Firm* — Carter, Deluca & Farrell LLP

(57) ABSTRACT

Disclosed is a method for cleaning a photo mask. The method includes a pre-treatment operation of wetting a chemical on an entire surface of the photo mask in a state in which the photo mask is stopped, and a cleaning operation of supplying the chemical to a pattern area of the photo mask in a state in which the photo mask is rotated.

4 Claims, 10 Drawing Sheets

(56) References Cited

U.S. PATENT DOCUMENTS

2016/0133487 A1   5/2016  Kanamitsu et al.
2017/0207079 A1   7/2017  Lee et al.

FOREIGN PATENT DOCUMENTS

| CN | 106057653 A | 10/2016 |
| JP | H10260522 A | 9/1998 |
| KR | 19980032598 U | 7/1998 |
| KR | 20070102076 A | 10/2007 |
| KR | 100828120 B1 | 5/2008 |
| KR | 20090019688 A | 2/2009 |
| KR | 20100053485 A | 5/2010 |
| KR | 20100128122 A | 12/2010 |
| KR | 20140073429 A | 6/2014 |
| KR | 101757820 B1 | 7/2017 |

OTHER PUBLICATIONS

Grant of Patent issued by the Korean Intellectual Property Office dated Dec. 10, 2019 in corresponding Korean Patent Application No. 10-2017-0133812, with English translation.

First Office Action issued by the State Intellectual Property Office of the People's Republic of China dated Jul. 27, 2020 in corresponding CN Patent Application No. 201811201628.2, with English translation and search.

* cited by examiner

MASK CLEANING APPARATUS AND METHOD FOR CLEANING MASK

CROSS-REFERENCE TO RELATED APPLICATIONS

This application claims priority under 35 U.S.C. § 119 to Korean Patent Application No. 10-2017-0133812 filed on Oct. 16, 2017, in the Korean Intellectual Property Office, the disclosures of which are incorporated by reference herein in their entireties.

BACKGROUND

Embodiments of the inventive concept described herein relate to a photo mask cleaning apparatus and a method for cleaning a photo mask, and more particularly to an apparatus and a method for cleaning a photo mask by supplying a chemical.

A photo mask is obtained by forming a fine circuit of a semiconductor on a quartz or glass substrate, and for example, is obtained by etching a semiconductor integrated circuit and an LCD pattern at a size that is 1 to 5 times as large as the actual sizes thereof by using a chrome thin film applied on an upper layer of a transparent quartz substrate. A fine pattern of a photo mask is formed on a substrate through a photolithographic process. The photolithographic process refers to all the processes of uniformly applying a photoresist on a substrate, reducing, projecting, and exposing a pattern on the photoresist by using exposure equipment such as a stepper, and forming a 2-dimensional photoresist pattern via a development process.

A cleaning process is performed to remove contaminants caused from various conditions, from the photo mask. In the photo mask cleaning process, a chemical is applied to an entire surface of a mask by rotating the mask while a chemical (a sulfuric peroxide mixture: SPM) is ejected to the center of the mask or a portion of the mask that is close to the center, and the applied chemical removes contaminants on the substrate. At this time, static electricity is generated at a portion of the mask, to which the chemical is discharged, at the moment when the chemical is discharged so that a pattern may be damaged due to arcing.

In more detail, static electricity is generated at a periphery of a chemical ejection hole as the chemical rapidly flows on the mask. Due to the structure of the mask, the generated static electricity is confined by the metal pattern, and the metal pattern is damaged when arcing is generated due to the accumulated static electricity. As illustrated in FIG. 10, the arcing is mainly generated at a point (a central red circle of FIG. 10) to which the chemical is initially ejected, and the metal pattern deformed due to arcing causes a fault in the exposure process.

SUMMARY

Embodiments of the inventive concept provide a photo mask cleaning apparatus and a method for cleaning a photo mask, by which damage to a metal pattern due to arcing may be prevented during a cleaning process.

The technical objects of the inventive concept are not limited to the above-mentioned ones, and the other unmentioned technical objects will become apparent to those skilled in the art from the following description.

In accordance with an aspect of the inventive concept, there is provided a method for cleaning a photo mask, the method including a pre-treatment operation of wetting a chemical on an entire surface of the photo mask in a state in which the photo mask is stopped, and a cleaning operation of supplying the chemical to a pattern area of the photo mask in a state in which the photo mask is rotated.

In the pre-treatment operation, the chemical may be supplied to a non-pattern area of the photo mask.

The pre-treatment operation may include moving a nozzle to the non-pattern area of the photo mask, and discharging the chemical from the nozzle located in the non-pattern area, and the chemical may be discharged in the non-pattern area until the entire surface of the photo mask is wetted with the chemical.

The cleaning operation may include moving the nozzle from the non-pattern area to the center of the pattern area, and discharging the chemical from the nozzle moved to the center of the pattern area.

The pre-treatment operation may include moving a nozzle to the non-pattern area of the photo mask, and discharging the chemical from the nozzle located in the non-pattern area, the nozzle may discharge the chemical while being moved from the non-pattern area to the center of the pattern area.

The chemical may be a mixture liquid of a sulfuric acid and a peroxide.

In accordance with another aspect of the inventive concept, there is provided a photo mask cleaning apparatus including a support plate configured to support a photo mask, a support plate driver configured to rotate the support plate, a nozzle configured to eject a chemical onto the photo mask positioned on the support plate, a nozzle driver configured to drive the nozzle, and a controller configured to control the support plate driver and the nozzle driver, and the controller controls the nozzle driver such that the nozzle starts supply of the chemical in a non-pattern area of the photo mask in a state in which the nozzle is stopped during execution of a cleaning process.

The controller may control the nozzle driver to move the nozzle to the center of a pattern area of the photo mask and eject the chemical after an entire surface of the photo mask is wetted by the chemical ejected from the nozzle.

The controller may control the support plate driver to rotate the photo mask from the time when the nozzle ejects the chemical at the center of the pattern area.

The controller may control the nozzle driver to move the nozzle from the non-pattern area to a pattern area of the photo mask such that an entire surface of the photo mask is wetted by the chemical ejected from the nozzle.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
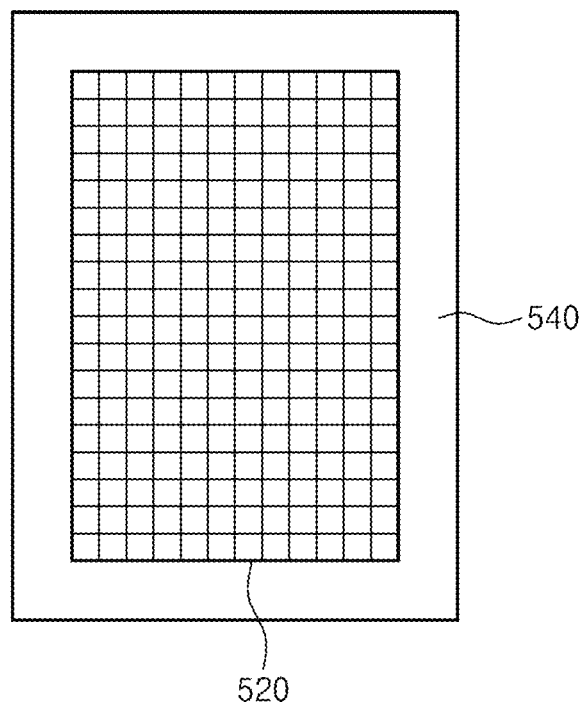
FIG. 1 is a plan view schematically illustrating a mask.

The inventive concept may be variously modified and may have various forms, and specific embodiments thereof will be illustrated in the drawings and described in detail. However, the inventive concept is not limited to specific disclosed forms, but it is understood that the scope of the inventive concept include all changes pertaining to the spirit and technical scope of the inventive concept, equivalents or replacements thereof. A detailed description of known technologies related to the inventive concept will be omitted to avoid making the technical essence of the inventive concept rather unclear.

The terminologies used herein are provided only to describe specific embodiments, and are not intended to limit the inventive concept. The terms of a singular form may include plural forms unless otherwise specified. The terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

The terms such as first and second may be used to describe various elements, but the elements are not limited to the terms. The terms may be used only for the purpose of distinguishing one element from another element.

Hereinafter, embodiments of the inventive concept will be described with reference to the accompanying drawings, and in a description of the inventive concept, the same reference numerals are given to the same or corresponding elements regardless of the reference numerals and a repeated description thereof will be omitted.

A mask cleaning apparatus according to the inventive concept cleans a mask such that an optical pattern is not damaged.

FIG. 1 is a plan view illustrating an example of a mask 500.

Referring to FIG. 1, a pattern area 520 exists at the center of the mask 500. A non-pattern area 540 exists at a periphery of the mask 500 to surround the pattern area 520. Although not illustrated, glue may be located between the pattern area 520 and the non-pattern area 540.

Figure 2:
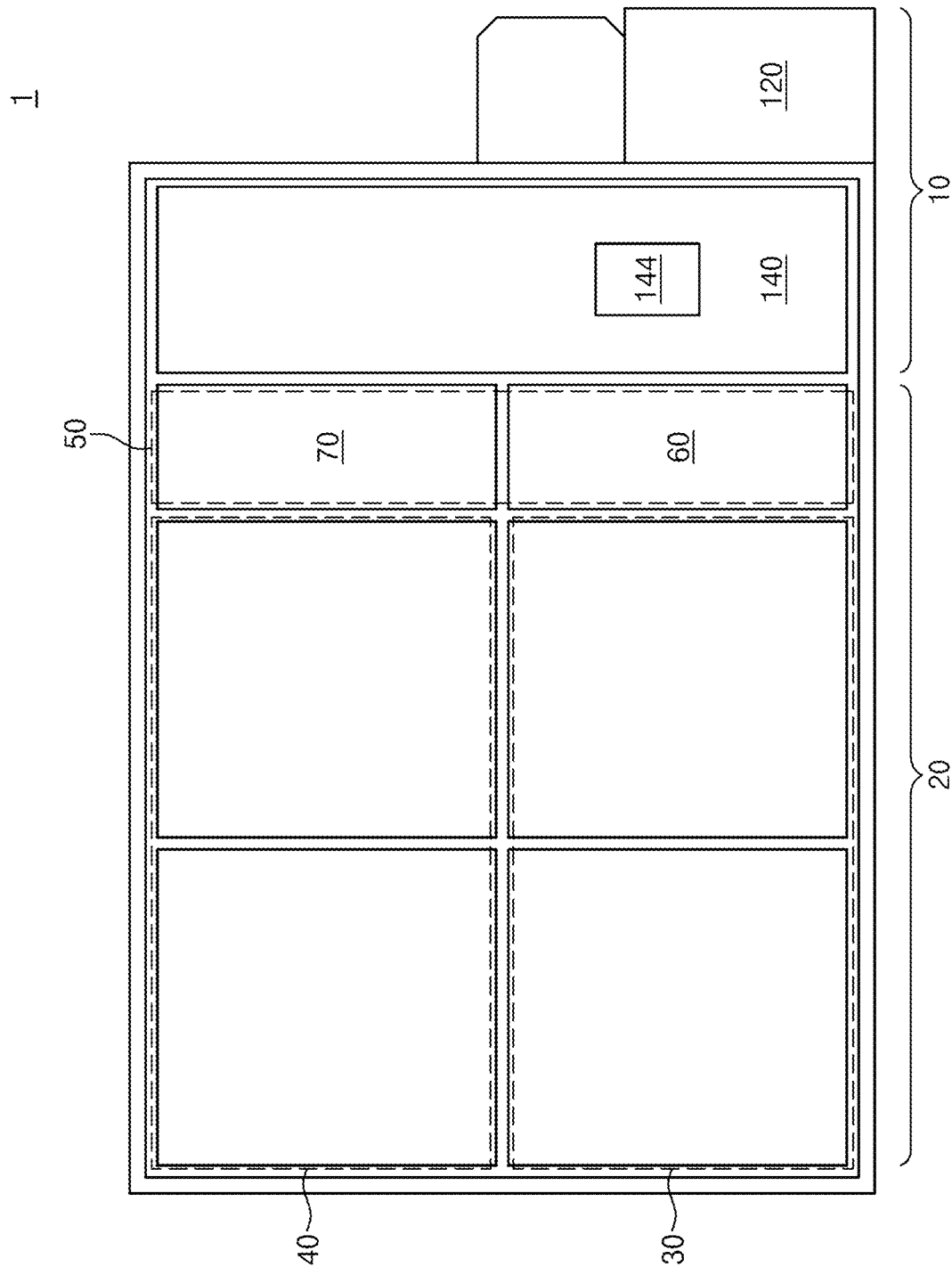
FIG. 2 is a view illustrating photo mask cleaning equipment according to an embodiment of the inventive concept.
Figure 3:
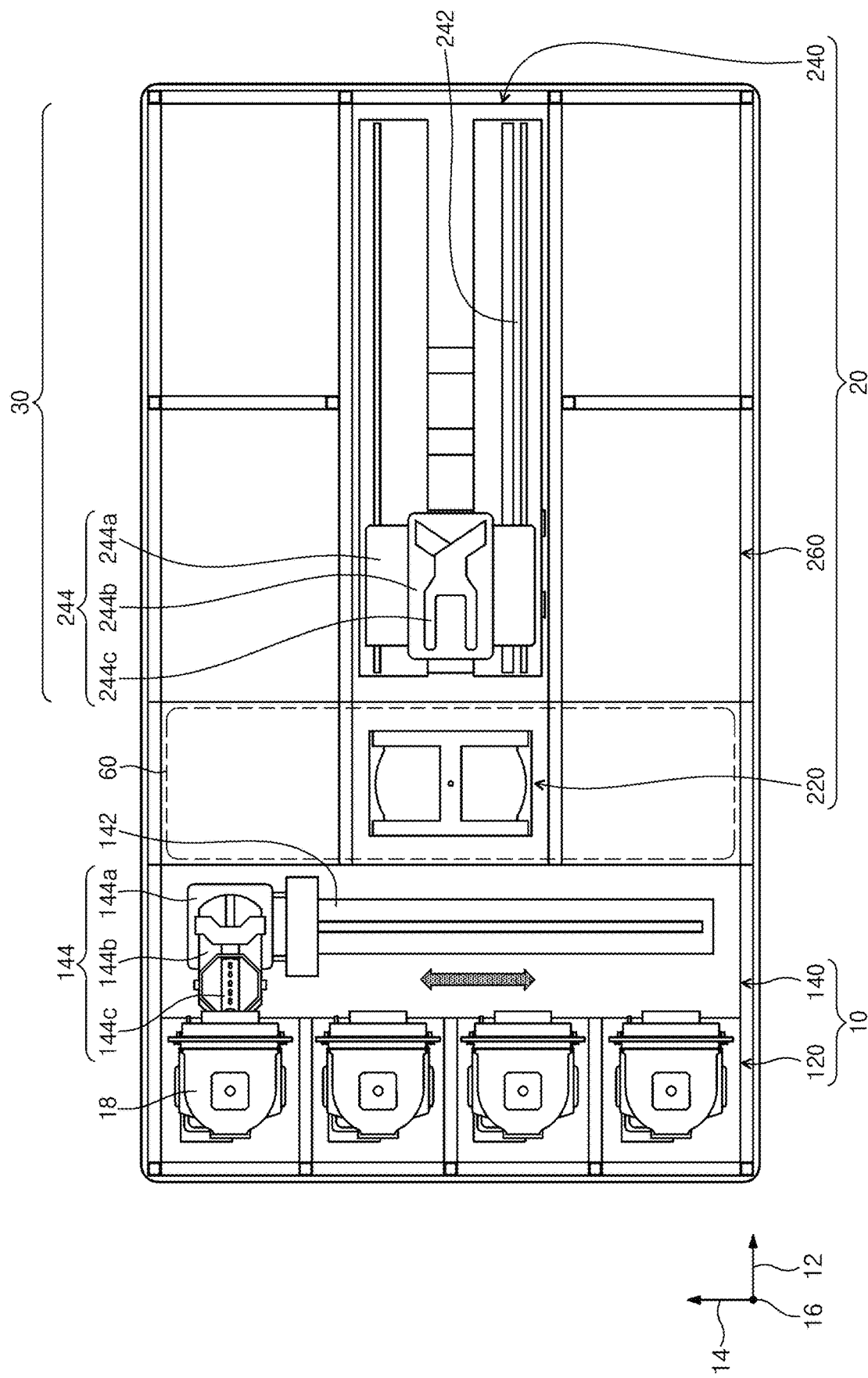
FIG. 3 is a view illustrating a first layer layout of the photo mask cleaning equipment illustrated in FIG. 2.
Figure 4:
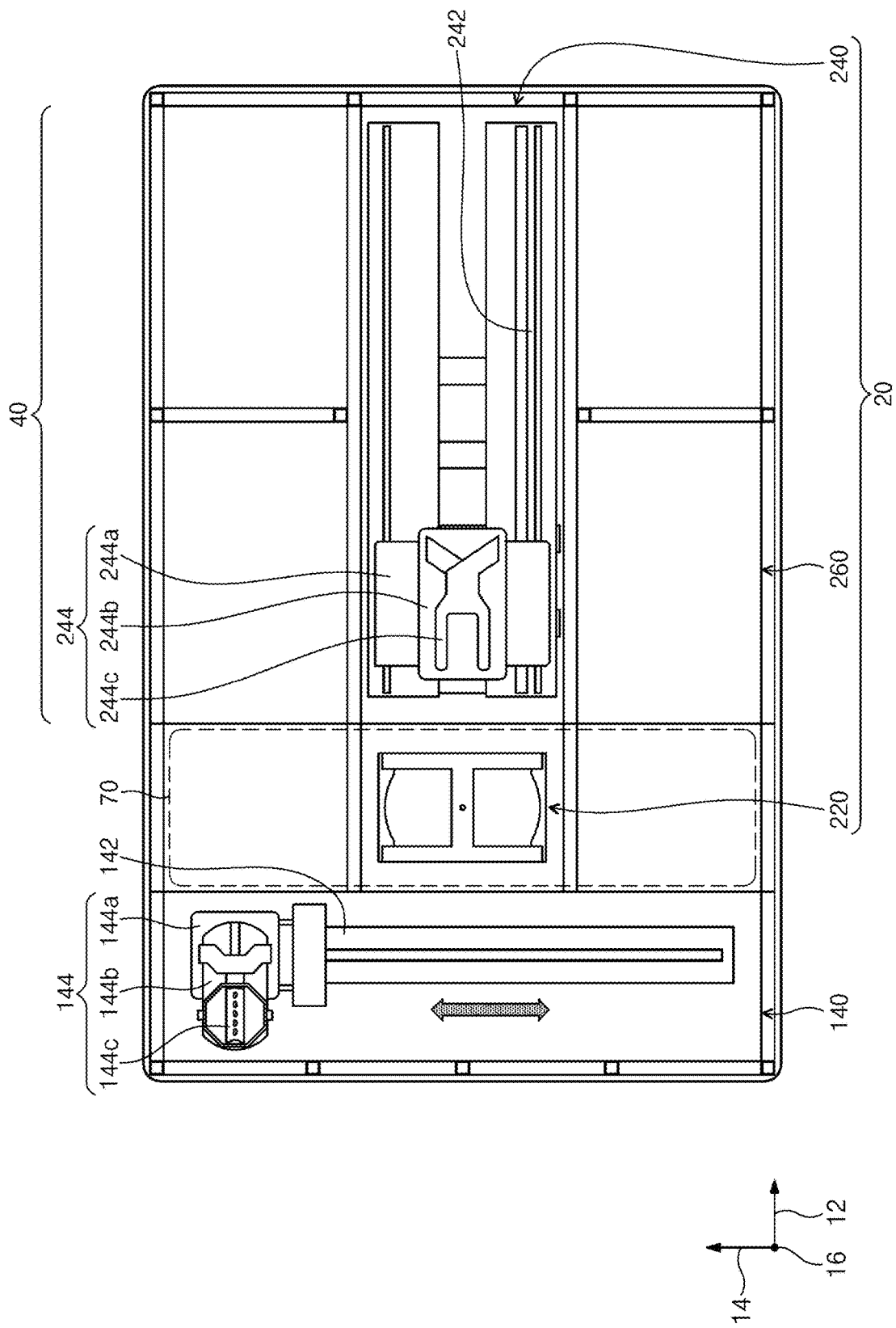
FIG. 4 is a view illustrating a second layer layout of the photo mask cleaning equipment illustrated in FIG. 2.

FIG. 2 is a view illustrating photo mask cleaning equipment according to an embodiment of the inventive concept. FIGS. 3 and 4 are views illustrating layouts of a first layer and a second layer of the photo mask cleaning equipment illustrated in FIG. 2.

Referring to FIGS. 2 to 4, the mask cleaning equipment 1 includes an index module 10 and a process executing module 20. The index module 10 includes load ports 120 and a feeding frame 140. The load ports 120, the feeding frame 140, and the process executing module 20 may be sequentially arranged in a row.

Hereinafter, a direction in which the load port 120, the feeding frame 140, and the process executing module 20 are arranged will be referred to an X direction 12. A direction that is perpendicular to the X direction 12 when viewed from the top will be referred to as a Y direction 14, and a direction that is normal to a plane including the X direction 12 and the Y direction 14 will be referred to as a Z direction 16.

A carrier 18, in which a mask 500 is received, is seated on the load port 120. A plurality of load ports 120 are provided, and are disposed along the Y direction 14 in a row. The number of the load ports 120 may increase or decrease according to a condition, such as the process efficiency of the process executing module 20 or a footprint. A plurality of slots (not illustrated) provided to support peripheries of mask 500 are formed in the carrier 18. A plurality of slots are provided along the Z direction 16, and the mask 500 is located in the carrier 18 such that the masks are stacked to be spaced apart from each other along Z direction 16.

The process executing module 200 includes an upper process module 40 and a lower process module 30. Each of the upper process module 40 and the lower process module 30 has a feeding housing 240, a buffer unit 220, and a process housing 260. The feeding housing 240 is disposed such that the lengthwise direction thereof is parallel to the X direction 12. Process housings 260 are disposed on opposite sides of the feeding housing 240 along the Y direction 14. The process housings 260 are provided on the opposite sides of the feeding housing 240 to be symmetrical to each other with respect to the feeding housing 240. A plurality of process housings 260 are provided on one side of the feeding housing 240. Some of the process housings 260 are disposed along the lengthwise direction of the feeding housing 240. Furthermore, some of the process housings 260 are disposed to be stacked on each other. That is, the process housings 260 having an array of A by B may be disposed on one side of the feeding housing 240. Here, A is the number of the process housings 260 provided in a row along the X direction 12, and B is the number of the process housings 260 provided in a row along the Y direction 14. When four or six process housings 260 are provided on one side of the feeding housing 240, the process housings 260 may be disposed in an array of 2 by 2 or 3 by 2. The number of the process housings 260 may increase or decrease. Unlike the above-mentioned description, the process housings 260 may be provided only on one side of the feeding housing 240. Further, unlike the above-mentioned description, the process housings 260 may be provided on one side or opposite sides of the feeding housing 240 to form a single layer.

The buffer unit 220 is disposed between the feeding frame 140 and the feeding housing 240. The buffer unit 220 provides a space in which the mask 500 stays before the mask is transported between the process housing 260 and the carrier 18. The buffer unit 220 has an upper buffer 70 and a lower buffer 60. The upper buffer 70 is located above the lower buffer 60. The upper buffer 70 is disposed at a height corresponding to the upper process module 40. The lower buffer 60 is disposed at a height corresponding to the lower process module 30. Each of the upper buffer 70 and the lower buffer 60 has a slot in which the mask 500 is positioned in the interior thereof, and a plurality of slots are provided to be spaced apart from each other along the Z direction 16. A face of the buffer unit 220 that faces the feeding frame 140 and a face of the buffer unit 220 that faces the feeding housing 240 are opened.

The feeding frame 140 transports the masks 500 between the carrier 18 seated on the load port 120 and the buffer unit 220. An index rail 142 and an index robot 144 are provided in the feeding frame 140. The index rail 142 is provided such that the lengthwise direction thereof is in parallel to the Y direction 14. The index robot 144 is installed on the index rail 142, and is linearly moved in the Y direction 14 along the index rail 142. The index robot 144 has a base 144a, a body 144b, and a plurality of index arms 144c. The base 144a is installed to be moved along the index rail 142. The body 144b is coupled to the base 144a. The body 144b is configured to be moved along the Z direction 16 on the base 144a. Further, the body 144b is configured to be rotated on the base 144a. The index arms 144c are coupled to the body 144b, and are configured to be moved forwards and rearwards with respect to the body 144b. A plurality of index arms 144c are configured to be driven individually. The index arms 144c are arranged to be stacked so as to be spaced apart from each other along the Z direction 16. Some of the index arms 144c are used when the masks 500 are transported to the carrier 18 in the process module 20, and some of the index arms 144c may be used when the masks 500 are transported from the carrier 18 to the process executing module 20. This structure may prevent particles generated from the masks 500 before the execution of the process from being attached to the masks 500 after the execution of the process in the process of carrying the masks 500 in and out by the index robot 144.

The feeding housing 240 transports the masks 500 between the buffer unit 220 and the process housings 260, and between the process housings 260. A guide rail 242 and a main robot 244 are provided in the feeding housing 240. The guide rail 242 is disposed such that the lengthwise direction thereof is parallel to the X direction 12. The main robot 244 is installed on the guide rail 242, and is linearly moved along the X direction 12 on the index rail 242. The main robot 244 has a base 244a, a body 244b, and a plurality of main arms 244c. The base 244a is installed to be moved along the guide rail 242. The body 244b is coupled to the base 244a. The body 244b is configured to be moved along the Z direction 16 on the base 244a. Further, the body 244b is configured to be rotated on the base 244a. The main arms 244c are coupled to the body 244b, and are configured to be moved forwards and rearwards with respect to the body 244b. A plurality of main arms 244c are configured to be driven individually. The main arms 244c are arranged to be stacked so as to be spaced apart from each other along the Z direction 16.

A mask cleaning apparatus that performs a cleaning process on the mask 500 is provided in the process housing 260. The mask cleaning apparatus may have different structures according to the types of the cleaning processes. Alternatively, the mask cleaning apparatuses in the process housings 260 may have the same structure. As an example, the lower process module 40 may include a chamber that performs a wet cleaning process and a chamber that performs a cooling process. The upper process module 30 may include a chamber that performs a dry/functional water cleaning process and a chamber that performs a heating process.

Hereinafter, the mask cleaning apparatus may be a chamber that performs the above-mentioned wet cleaning process. An example of the mask cleaning apparatus that cleans the mask 500 by using a chemical will be described.

Figure 5:
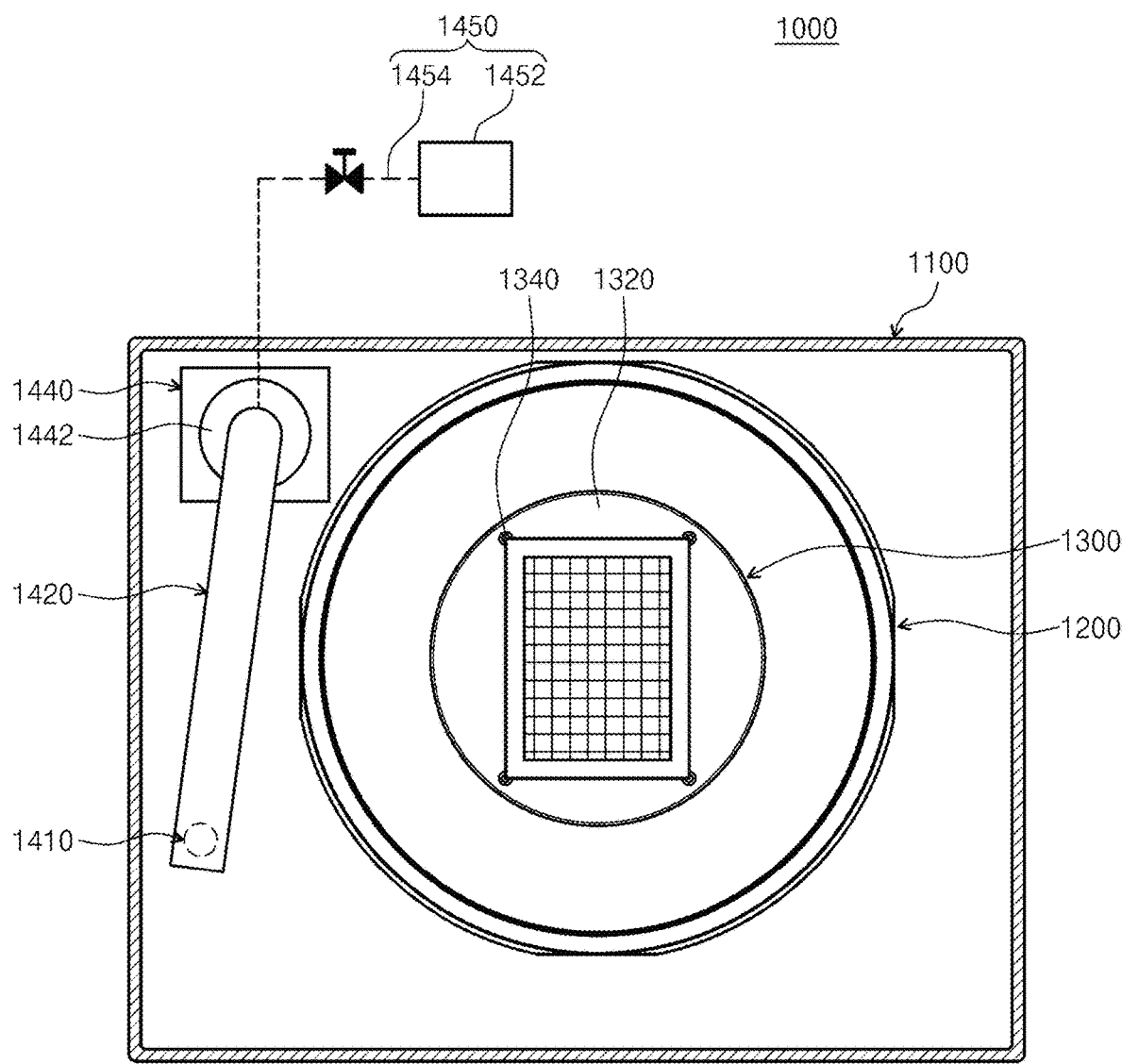
FIG. 5 is a plan view illustrating a mask cleaning apparatus illustrated in FIG. 4.
Figure 6:
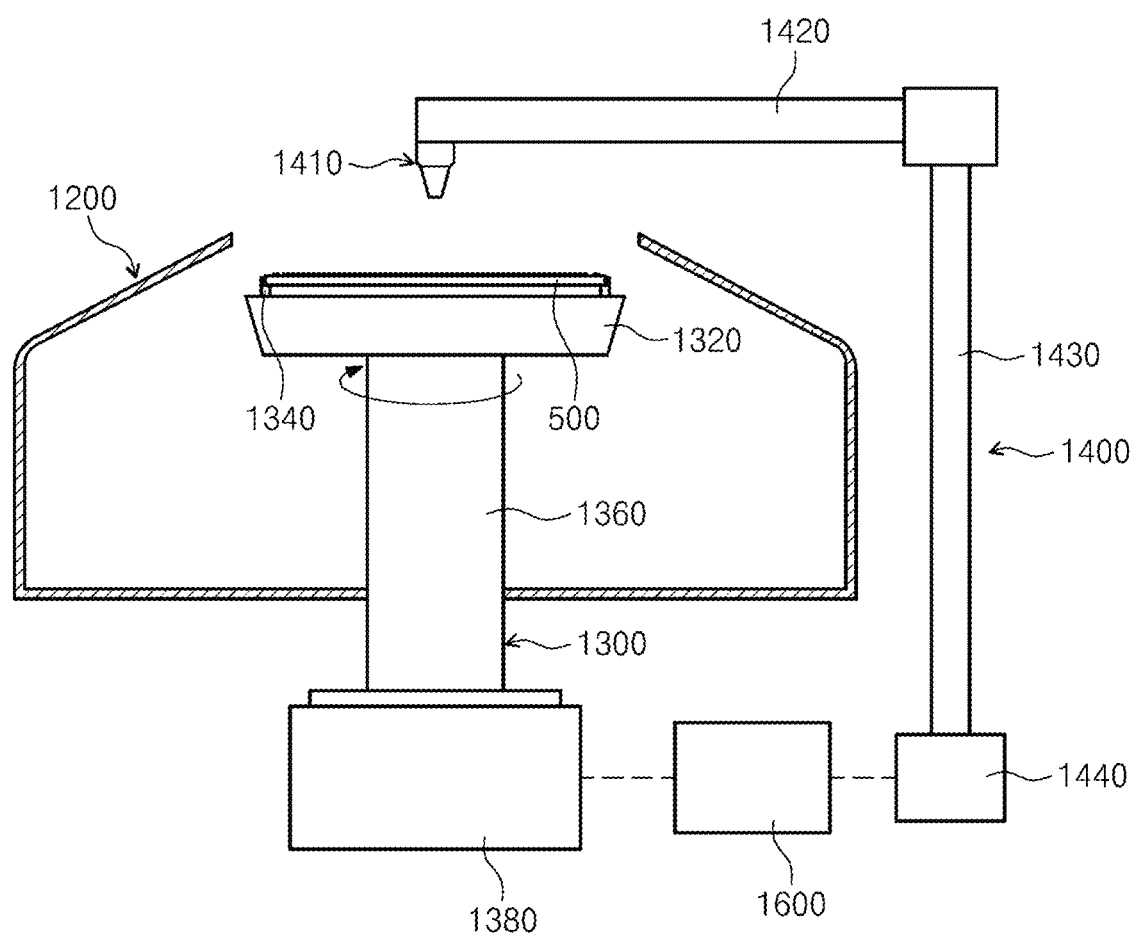
FIG. 6 is a side view illustrating the mask cleaning apparatus of FIG. 5.

FIG. 5 is a plan view illustrating a mask cleaning apparatus 1000 illustrated in FIG. 4. FIG. 6 is a side view illustrating the mask cleaning apparatus 1000 of FIG. 5.

The mask cleaning apparatus 1000 cleans a mask without any damage to a metal pattern due to arcing.

Referring to FIG. 5, the mask cleaning apparatus 1000 includes a housing 1100, a container 1200, a support member 1300, a pattern cleaning unit 1400, and a controller 1600.

The housing 1100 provides a sealed interior space. A fan filter unit (not illustrated) is installed on an upper wall of the housing 1100. The fan filter unit generates vertical air currents that faces the lower side, in an interior space of the housing 1100.

The container 1200 is provided in the interior of the housing 1100. The container 1200 prevents the chemical used in the process and fumes generated during the process from spattering or being discharged to the outside. The container 1200 has a space an upper side of which is opened and in which the mask 500 is treated, in the interior thereof.

The support member 1300 is located in the container 1200. The support member 1300 supports the mask 500 during the process. The support member 1300 includes a support plate 1320, a chucking pin 1340, a support shaft 1360, and a support plate driver 1380.

The support plate 1320 has a substantially circular shape. The support plate 1320 has a diameter that is larger than that of the mask 500. The support plate 1320 supports the mask 500. While the chemical is supplied, the mask is supported by the support plate 1320 to face the upper side. Chucking pins 1340 are provided on the upper surface of the support plate 1320. The chucking pins 1340 protrude from the upper surface of the support plate 1320 to the upper side. The chucking pins 1340 prevents the mask 500 from deviating laterally from the support plate 1320 when the support plate 1320 is rotated. When the mask 500 is positioned at a proper location on the support plate 1320, two chucking pins 1340 are provided at each of the corners of the mask 500. Accordingly, a total of eight chucking pins 1340 are provided. During execution of the process, the chucking pins 1340 prevent the mask 500 from deviating from the proper location by supporting the four corners of the mask 500. The support shaft 1360 is connected to the center of the lower side of the support plate 1320. The support shaft 1360 supports the support plate 1320. The support shaft 1360 is provided to correspond to the central axis of the support plate 1320. The support plate driver 1380 is connected to a lower end of the support shaft 1360. The support plate driver 1380 rotates the support plate 1320. The support shaft 1360 transmits a rotational force of the support plate driver 1380 to the support plate 1320. The support plate driver 1380 is controlled by the controller 1600. The support plate driver 1380 may include a motor.

An elevation unit (not illustrated) moves the container 1200 upwards and downwards such that a relative height of the support plate 1320 with respect to the container 1200 may be adjusted. The elevation unit lowers the container 1200 such that the support plate 1320 protrudes to the upper side of the container 1200 when the mask 500 is loaded on the support plate 1320 or unloaded from the support plate 1320.

The pattern cleaning shaft 1400 is disposed on one side of the container 1200. The pattern cleaning unit 1400 removes contaminants on a surface of the mask 500 by supplying the chemical to the upper surface of the mask 500. The pattern cleaning unit 1400 includes a nozzle 1410, a nozzle arm 1420, an arm support shaft 1360, a nozzle driver 1440, and a chemical supply unit 1450.

The nozzle driver 1440 may be controlled by the controller 1600.

As an example, the chemical supported by the chemical supply unit may include a mixture (a sulfuric peroxide mixture: SPM) of a sulfuric acid and a peroxide.

Figure 7:
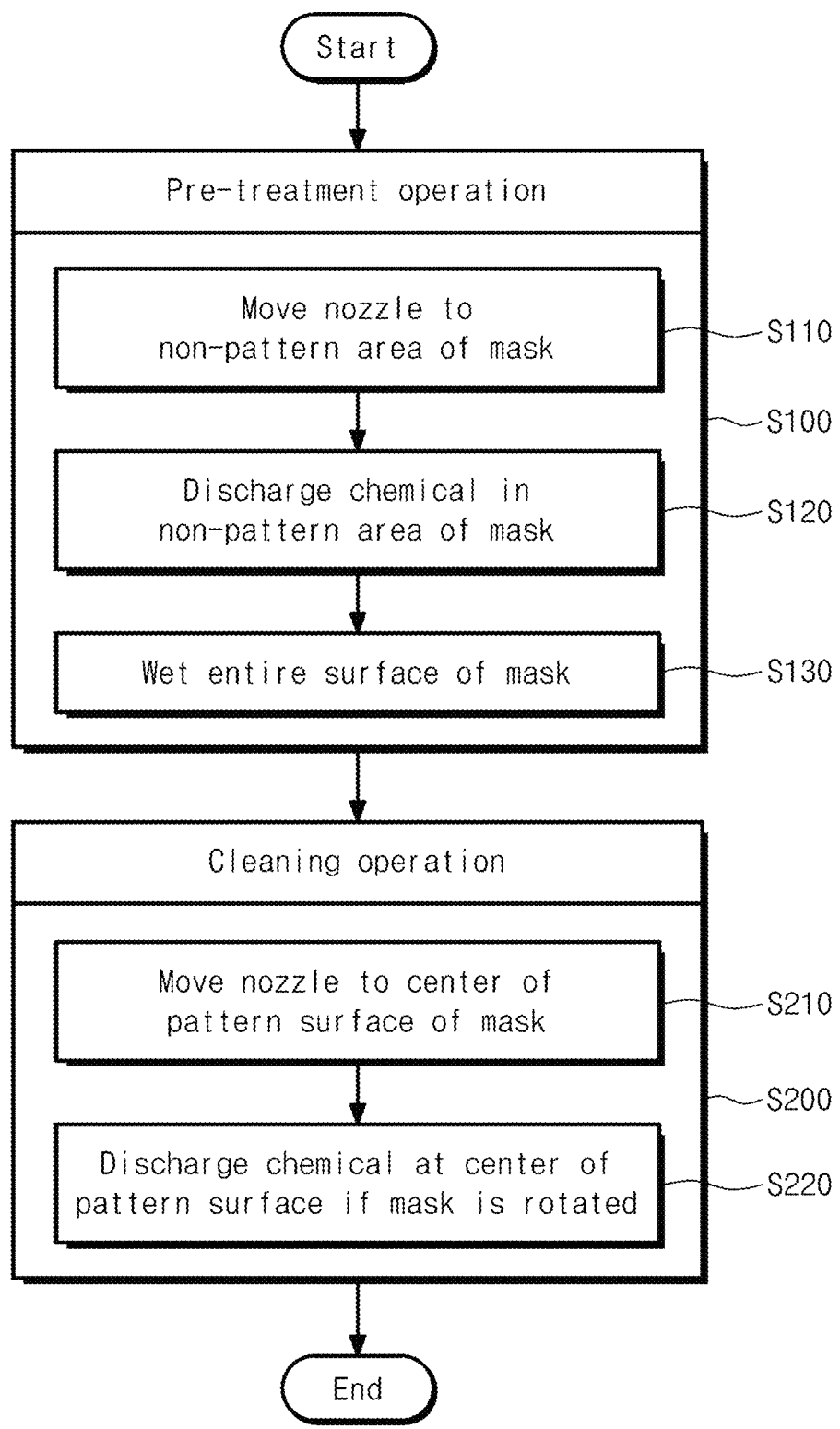
FIG. 7 is a flowchart briefly illustrating a method for cleaning a photo mask.
Figure 8A:
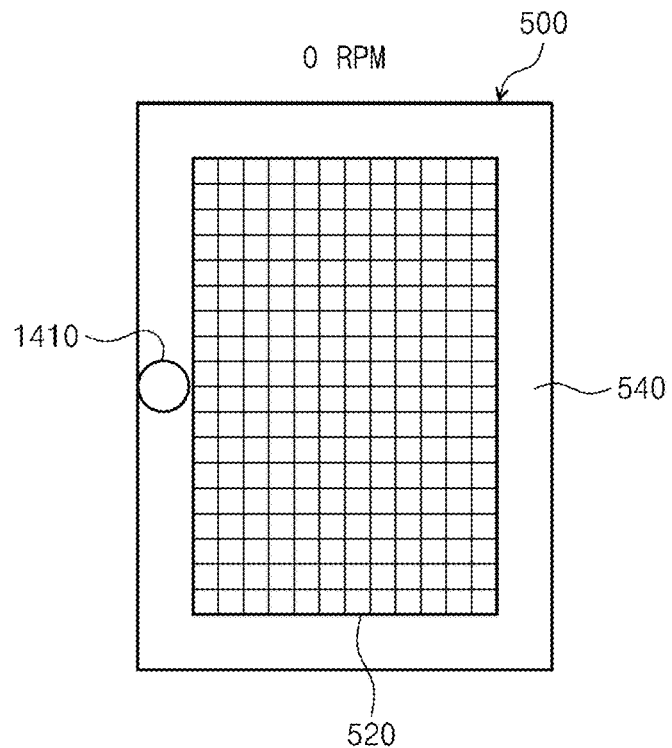
FIGS. 8A to 8D are views illustrating a process of discharging a chemical on a photo mask in stages.
Figure 8B:
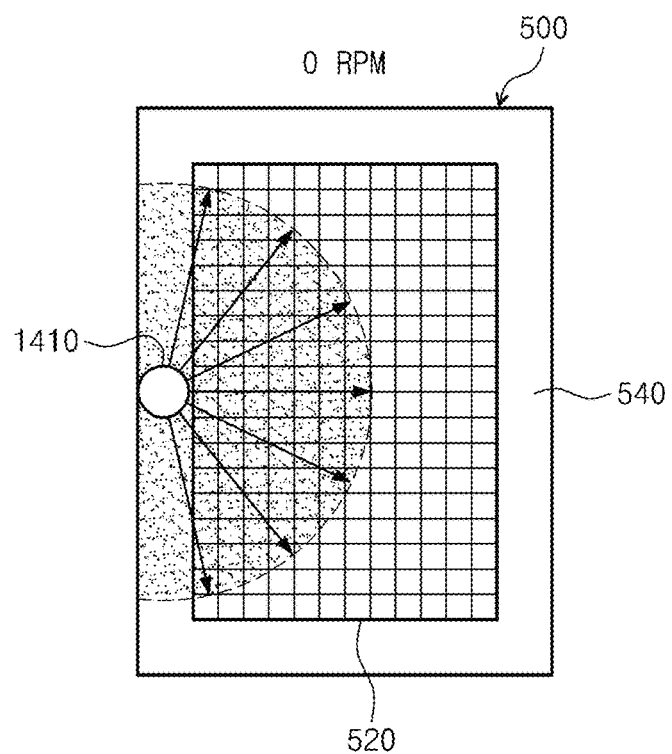
Figure 8C:
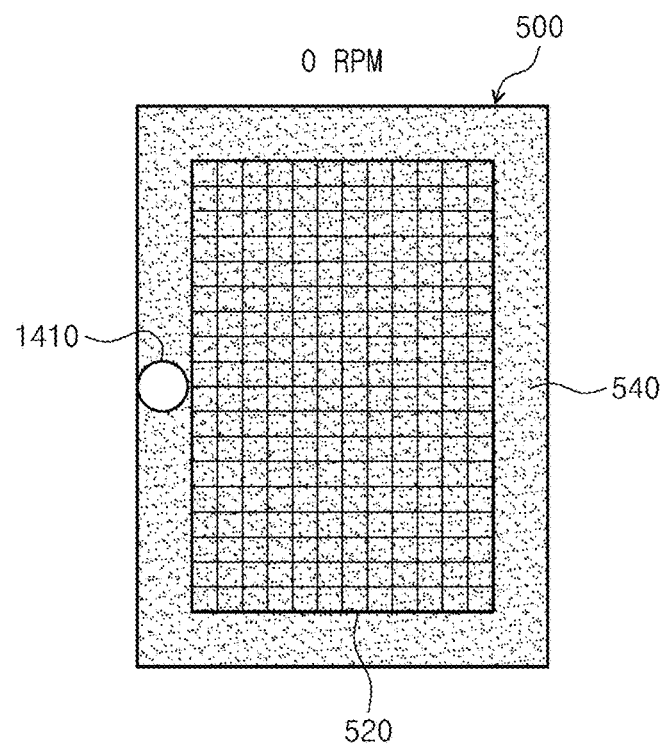
Figure 8D:
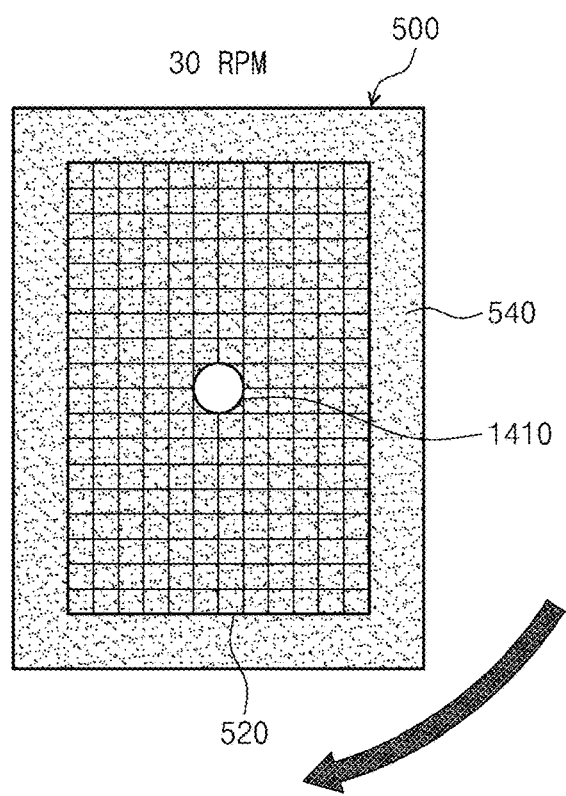
Figure 9:
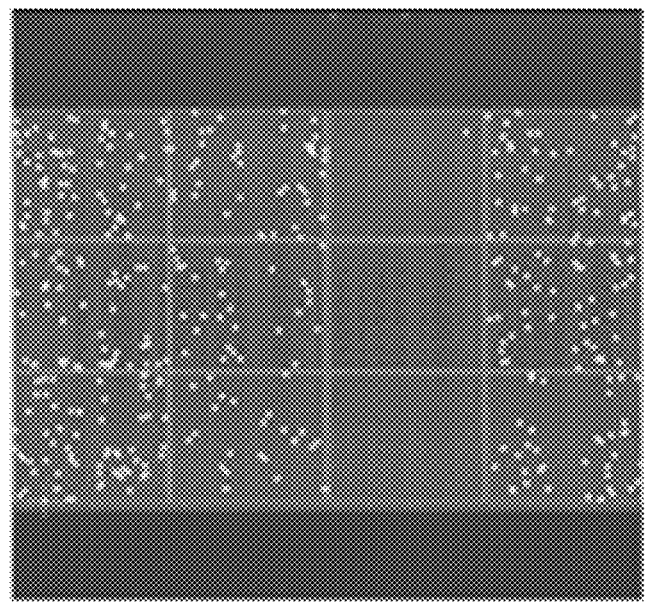
FIG. 9 is a view illustrating a state in which there is no arcing damage in a photo mask cleaning process according to the inventive concept.
Figure 10:
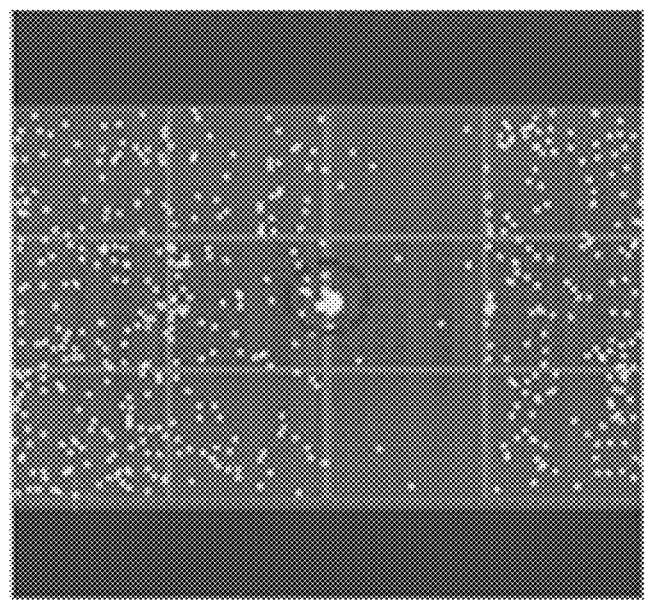
FIG. 10 is a view illustrating an arcing damage generated in a photo mask cleaning process according to the related art.

FIG. 7 is a flowchart briefly illustrating a method for cleaning a photo mask. FIGS. 8A to 8D are views illustrating a process of discharging a chemical on a photo mask in stages. FIG. 9 is a view illustrating a state in which there is no arcing damage in a photo mask cleaning process according to the inventive concept.

Referring to FIGS. 4 to 8D, the method for cleaning a photo mask according to the inventive concept is characterized that arcing may be prevented by starting discharge of the chemical while the photo mask 500 is stopped in a non-pattern area 540 in which there is no pattern (see FIG. 9), and the chemical is ejected while the photo mask is rotated after the nozzle 1410 is moved to the center of the pattern area 520 when the entire surface of the photo mask 500 is applied with the chemical while the photo mask 500 is stopped.

As an example, the photo mask cleaning method may include a pre-treatment operation S100 and a cleaning operation S200.

In the pre-treatment operation S100, the chemical is wetted on the entire surface of the photo mask 500 while the photo mask 500 is stopped. In the pre-treatment operation S100, the chemical is supplied to the non-pattern area 540 of the photo mask 500. The pre-treatment operation S100 includes an operation S110 of moving the nozzle assembly 1410 to the non-pattern area 540 of the photo mask 500 and an operation S120 of discharging the chemical from the nozzle 1410 located in the non-pattern area 540, and the chemical is discharged in the non-pattern area 540 until the entire surface of the photo mask 500 is wetted by the chemical. The chemical discharging process is provided by controlling the nozzle driver 1440 with the controller 1600.

In the cleaning operation S200, the chemical is supplied to the pattern area 520 of the photo mask 500 while the photo mask 500 is rotated. The cleaning operation S200 may include an operation S210 of moving the nozzle 1410 from the non-pattern area 540 to the center of the pattern area 520 and an operation S220 of discharging the chemical from the nozzle 1410 that was moved to the center of the pattern area 520. In the cleaning operation, the support plate driver 1380 is controlled by the controller 1600.

When the chemical is ejected in the non-pattern area 540, the substrate should not be rotated such that the chemical is applied to the entire pattern area 520, and the chemical is continuously supplied after the substrate starts to be rotated from the time when the chemical is applied to the entire surface of the photo mask 500.

In this way, in the method for cleaning a mask according to an embodiment of the inventive concept, because the chemical is supplied while the substrate is rotated after the chemical is wetted on the entire surface of the photo mask 500 slowly in a state in which arcing is not generated in the pattern area, by ejecting the chemical in the non-pattern area corresponding to a periphery of the pattern area, damage to the metal pattern due to arcing may be prevented.

According to an embodiment of the inventive concept has a special effect of preventing arcing by staring discharge of the chemical while the photo mask is stopped in the non-pattern area with no pattern.

The effects of the inventive concept are not limited to the above-mentioned effects, and the unmentioned effects can be clearly understood by those skilled in the art to which the inventive concept pertains from the specification and the accompanying drawings.

The above description is a simple exemplification of the technical spirit of the inventive concept, and the inventive concept may be variously corrected and modified by those skilled in the art to which the inventive concept pertains without departing from the essential features of the inventive concept. Therefore, the disclosed embodiments of the inventive concept do not limit the technical spirit of the inventive concept but are illustrative, and the scope of the technical spirit of the inventive concept is not limited by the embodiments of the inventive concept. The scope of the inventive concept should be construed by the claims, and it will be understood that all the technical spirits within the equivalent range fall within the scope of the inventive concept.

What is claimed is:

1. A method for cleaning a photo mask, the method comprising: in a pre-treatment operation in a state in which the photo mask is stopped: moving a nozzle to a non-pattern area of the photo mask;
    and discharging a chemical from the nozzle to the non-pattern area only when the nozzle is above the non-pattern area; in a cleaning operation in a state in which the photo mask is rotated after an entire surface of the photo mask is wetted with the chemical in the pre-treatment operation: supplying the chemical to a pattern area of the photo, wherein the entire surface is divided into the pattern area in a center of the photo mask and the non-pattern area in a periphery of the photo mask.

2. The method of claim 1, wherein the cleaning operation includes:
    moving the nozzle from the non-pattern area to the center of the pattern area; and
    discharging the chemical from the nozzle moved to the center of the pattern area.

3. The method of claim 1,
    wherein the nozzle discharges the chemical while being moved from the non-pattern area to the center of the pattern area.

4. The method of claim 1, wherein the chemical is a mixture liquid of a sulfuric acid and a peroxide.

* * * * *